United States Patent
Schoen et al.

(10) Patent No.: US 9,364,807 B2
(45) Date of Patent: Jun. 14, 2016

(54) COMPONENT OF A BIOSENSOR AND PROCESS FOR PRODUCTION

(75) Inventors: Christian Schoen, Dresden (DE); Michael Wagner, Dortmund (DE)

(73) Assignee: BOEHRINGER INGELHEIM MICROPARTS GMBH, Dortmund (DE)

( * ) Notice: Subject to any disclaimer, the term of this patent is extended or adjusted under 35 U.S.C. 154(b) by 739 days.

(21) Appl. No.: 13/635,972

(22) PCT Filed: Mar. 10, 2011

(86) PCT No.: PCT/EP2011/053573
§ 371 (c)(1),
(2), (4) Date: Oct. 24, 2012

(87) PCT Pub. No.: WO2011/120773
PCT Pub. Date: Oct. 6, 2011

(65) Prior Publication Data
US 2013/0126022 A1    May 23, 2013

(30) Foreign Application Priority Data
Mar. 31, 2010  (EP) .................................... 10158661

(51) Int. Cl.
*B01J 4/00*    (2006.01)
*B01D 3/00*    (2006.01)
(Continued)

(52) U.S. Cl.
CPC ........... *B01J 4/001* (2013.01); *B01L 3/502707* (2013.01); *B01L 3/502738* (2013.01);
(Continued)

(58) Field of Classification Search
CPC .................... B01L 3/502738; B01L 1/502746; B01L 1/502707; B01L 2200/0621; B01L 2300/0636; B01L 2300/0816; B01L 2300/0864; B01L 2300/161; B01L 2400/0688; B81C 1/00047; B81C 1/00055; B81C 1/00063; B81C 1/00071; B81C 1/00079; B81C 1/00087; B81C 1/00206; B81C 2201/0105; B81C 2201/0109; B81C 2201/0143; B81C 2201/0156
See application file for complete search history.

(56) References Cited

U.S. PATENT DOCUMENTS 5,958,345  A      9/1999  Turner et al.
6,939,450  B2 *   9/2005  Karinka et al. ............... 204/409
(Continued)

FOREIGN PATENT DOCUMENTS

EP    1426108 A1    6/2004
EP    1441131 A1    7/2004
(Continued)

OTHER PUBLICATIONS

Cho, Hansang et al. "How the capillary burst microvalve works." J. Colloid and Interface Science (2007) 306 379-385.*
International Search Report and Written Opinion for PCT/EP2011/053573 mailed on Jul. 27, 2011.

*Primary Examiner* — Christopher A Hixson
(74) *Attorney, Agent, or Firm* — Michael P. Morris; Mary-Ellen M. Devlin

(57) ABSTRACT

The invention relates to a component (4) of a biosensor, comprising at least one first device (6) for receiving a sample liquid, wherein the device (6) is connected via a distributor channel (7) to further receiving devices (8 to 11), into each of which a feed channel (71, 72, 73, 74) branching off from the distributor channel (7) opens, and the feed channels (71, 72, 73, 74) are arranged in succession in flow direction (S) of the sample liquid passed on through the distributor channel (7). In accordance with the invention, it is envisaged that, in the distributor channel (7), in each case between two immediately successive feed channels (71, 72; 72, 73; 73, 74) in flow direction (S), at least one region (K) for at least temporary slowing or stoppage of the capillary flow of the sample liquid has been inserted. It is thus possible to control the capillary flow of the sample liquid such that always only one receiving device (8, 9, 10, 11) is filled with the volume flow of sample liquid available before the next is filled, and effectively simultaneous filling of the receiving devices (8, 9, 10, 11) is prevented. This leads to rapid and complete filling of the respective receiving device (8, 9, 10, 11). Additionally presented is a process with which the regions (K) can be inserted into the distributor channel (7) in a simple manner.

11 Claims, 4 Drawing Sheets

Figure 1:
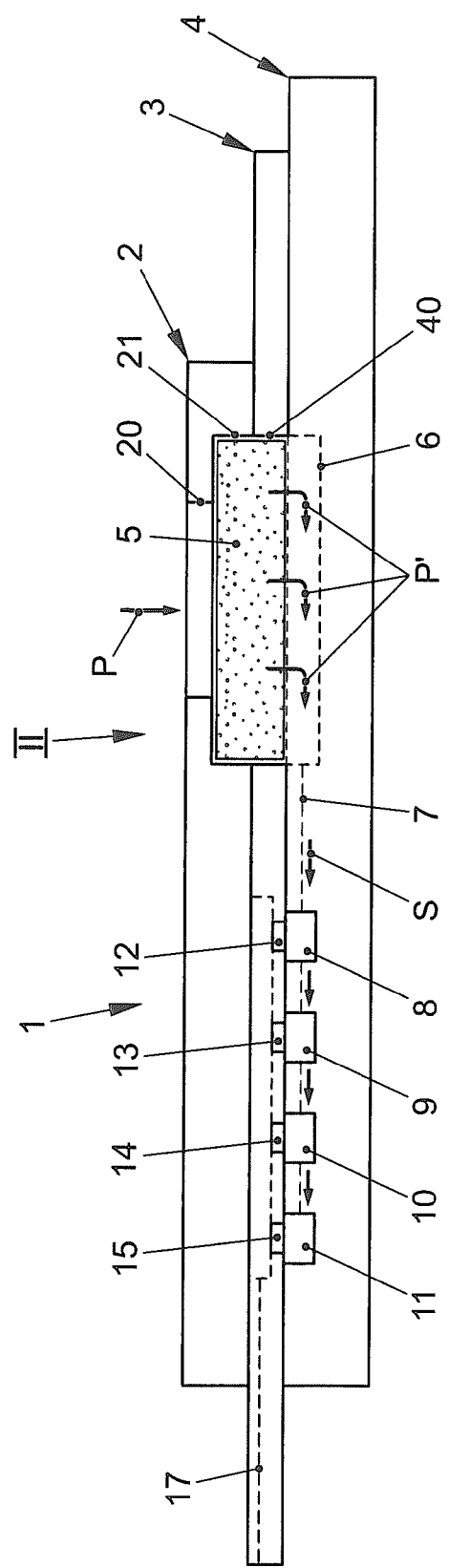

(51) Int. Cl.
*B81C 1/00* (2006.01)
*B01L 3/00* (2006.01)

(52) U.S. Cl.
CPC ....... *B01L3/502746* (2013.01); *B81C 1/00063* (2013.01); *B01L 2200/0621* (2013.01); *B01L 2200/10* (2013.01); *B01L 2300/0636* (2013.01); *B01L 2300/0681* (2013.01); *B01L 2300/0816* (2013.01); *B01L 2300/0822* (2013.01); *B01L 2300/0864* (2013.01); *B01L 2300/0887* (2013.01); *B01L 2300/161* (2013.01); *B01L 2400/0406* (2013.01); *B01L 2400/0688* (2013.01); *B01L 2400/088* (2013.01); *B81C 1/00047* (2013.01); *B81C 2201/0105* (2013.01); *B81C 2201/0143* (2013.01); *B81C 2201/0156* (2013.01); *Y10T 137/85938* (2015.04)

(56) References Cited

U.S. PATENT DOCUMENTS

| | | | |
|---|---|---|---|
| 7,036,917 | B2 | 5/2006 | Muller-Chorus et al. |
| 7,134,453 | B2 | 11/2006 | Peters et al. |
| 2007/0161928 | A1 | 7/2007 | Sprenkels et al. |
| 2008/0176398 | A1* | 7/2008 | Jain et al. .................. 438/674 |
| 2009/0053106 | A1 | 2/2009 | Wu et al. |
| 2010/0075422 | A1 | 3/2010 | Bielke et al. |
| 2013/0126022 | A1 | 5/2013 | Schoen et al. |

FOREIGN PATENT DOCUMENTS

| | | |
|---|---|---|
| EP | 1925365 A1 | 5/2008 |
| WO | 2011120773 A1 | 10/2011 |

* cited by examiner

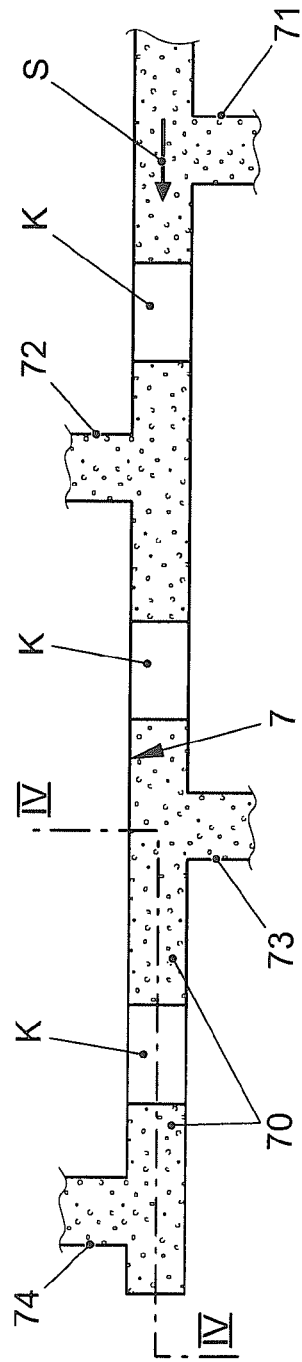
FIG. 3a
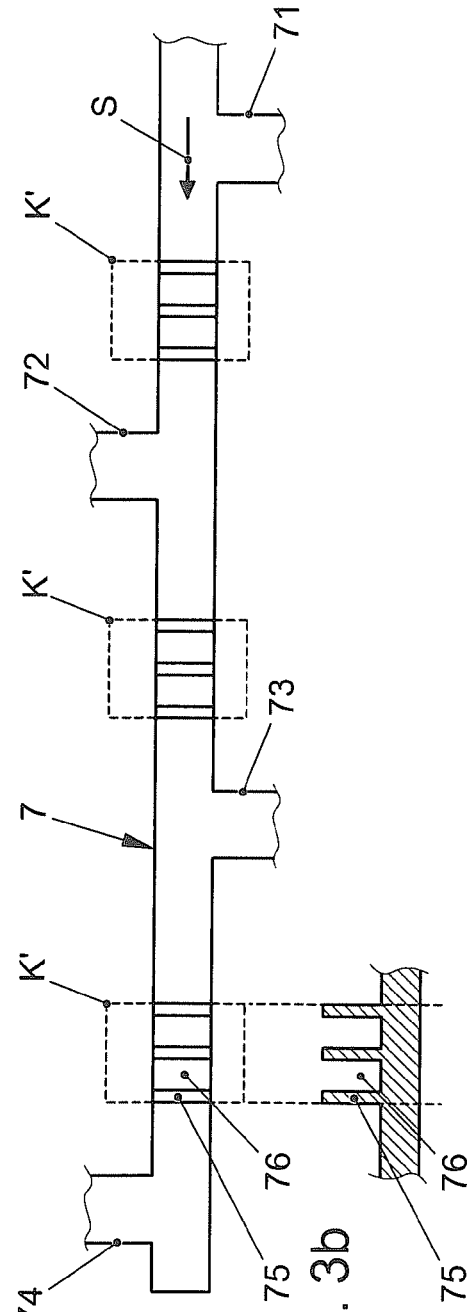
FIG. 3b
FIG. 3bb

COMPONENT OF A BIOSENSOR AND PROCESS FOR PRODUCTION

The invention relates to a component of a biosensor, comprising at least one first device for receiving a sample liquid, wherein the device is connected via a distributor channel to further receiving devices, into each of which a feed channel branching off from the distributor channel opens, and the feed channels are arranged in succession in the direction of flow of the sample liquid conveyed through the distributor channel.

In modern medical diagnostics an ever increasing number of biosensors are used, under which so-called diagnostic test strips are to be subsumed. Using biosensors, for example, biological liquids (e.g. blood, urine or saliva) can be examined on the one hand for pathogens and incompatibilities and on the other hand for a content of for example glucose (blood sugar) or cholesterol (blood fat).

Detection reactions or entire reaction cascades take place on the biosensors for this purpose. This requires the biological sample liquid (test liquid) to be transported to the reaction site or sites envisaged for this. Biosensors therefore consist of at least one microchannel or a microchannel system, through which the sample liquid is transported. Microchannels typically have a height and width of about 5 to 1500 microns. For controlled movement (transporting) of the sample liquid various methods such as electrokinetics, pressure or capillarity can be used. These methods may be used individually or combined with one another. In electrokinetics, the electrokinetic flow is achieved by applying electric voltage to the channels. The phenomena that occur (electroosmosis and electrophoresis) lead to the movement of charged molecules. When pressures are applied, for example by micropumps, uncharged molecules may also be moved. However, besides these two so-called active methods, so-called passive movement is also very important. In this, the sample liquids are moved in controlled manner purely by making use of the capillary force. An advantage of this technique is that it does not require any further drive mechanisms and thus enables the system as a whole to be simplified.

The modern development of the biosensors aims to shorten the measuring time between placing the sample liquid on the biosensor and the appearance of the measurement results. This measuring time, i.e. the time between placing the sample liquid on the biosensor and the measurement results being displayed, besides the actual reaction time of the reagents used with the sample liquid and any subsequent reactions, is also dependent on how quickly the sample liquid is transported within the biosensor from the point of addition of the sample liquid to the reaction site. Rapid transporting of the liquid is usually guaranteed by a hydrophilic coating of the channels.

Moreover, the trend is towards developing biosensors with an ever smaller volume of liquid, so as to reduce the pain of taking blood samples from diabetic patients, for example. Because of the limitations on the sample liquid it is therefore all the more important that sufficient sample liquid is supplied to the reaction sites to enable a satisfactory reaction of the reagents contained in the reaction sites with the sample liquid. As a rule the reaction sites of a biosensor are chamber-like devices for receiving the sample liquid (reaction chambers).

A biosensor (sample carrier) that forms the preamble of claim 1 is known from WO 99/46045. It uses only capillary forces to transport the sample liquid. In order to produce capillary forces and achieve optimum filling of the reaction chambers provided in the biosensor, special means are provided in each reaction chamber, at the entrance area to the particular feed channel, in order to produce a capillary force for conveying the sample liquid from the feed channel into the respective reaction chamber. During the distribution of the sample liquid through the distributor channels provided and the feed channels that branch off from them, every effort is made to ensure that the sample liquid fills all the reactions chambers as uniformly as possible and, more particularly, simultaneously.

However, the applicant has established that it can also be desirable (particularly when there is only a small amount of sample liquid available) if the reaction chambers are filled not simultaneously but consecutively (sequentially).

The problem on which the present invention is based is to provide a component of a biosensor by means of which it is possible to achieve a substantially sequential filling of receptacles provided in the biosensor for sample liquid, particularly reaction chambers containing reagents.

This problem is solved by the features of claim 1. The sub-claims contain advantageous embodiments of the invention.

The invention starts from a component of a biosensor, having at least one first device for receiving a sample liquid, wherein the first receiving device is connected via a distributor channel to further receiving devices, into each of which a feed channel branching off from the distributor channel opens, and the feed channels are arranged in succession in the direction of flow of the sample liquid conveyed through the distributor channel.

In accordance with the invention it is envisaged that at least one region for at least temporarily slowing down or stopping the capillary flow of the sample liquid has been inserted, in the distributor channel, in each case between two immediately consecutive feed channels in the direction of flow.

This makes it possible to control the capillary flow of the sample liquid in the distributor channel such that first of all a first receiving device which is to be filled with sample liquid and which may for example contain specific reagents, is filled completely or sufficiently to enable the reagents for example to dissolve properly therein and thus allow a satisfactorily reaction of the reagents with the sample liquid. Only then does the (temporarily slowed) sample liquid reach the receiving device that is next in the direction of flow or (in the case of a temporary stop) resume its travel to the next receiving device. The resumption of movement may be initiated automatically (for example by hydrostatic pressure) or controlled from outside (for example by the application of external pressure). This ensures that each receiving device embodied for example as a reaction chamber is initially filled quickly and as much as possible with sample liquid before the sample liquid flows onwards to the next receiving device (in the direction of flow) or reaches it and then fills it up as well. The process can be repeated as many times as there are receiving devices to be filled with the sample liquid.

According to a first further feature of the invention, it is provided that the at least one region for at least temporarily slowing down or stopping the capillary flow of the sample liquid is formed by at least one hydrophobic surface provided in the distributor channel The distributor channel which is otherwise of hydrophilic construction, to speed up the capillary flow, is thus made deliberately hydrophobic in this region. The hydrophobic surface of the distributor channel in this region may be produced for example by means of a hydrophobic coating, or by the removal of a hydrophilic coating that has optionally been provided in this region, which makes sense if the underlying base material of the distributor channel consists of a material that has less hydrophilic properties than the coating itself. This is the case for example with polystyrene, polypropylene, polycarbonate or PMMA.

It may be advantageous if the at least one region for at least temporarily slowing down or stopping the capillary flow of the sample liquid forms a widened cross-section of the distributor channel. Such a widening of the cross-section of the distributor channel can further intensify the desired effect in this region. An additional widening of the cross-section would occur, for example, if a hydrophilic coating of the distributor channel were removed in this region. The cross-sectional widening of the distributor channel would correspond at least to the amount of thickness of the hydrophilic coating removed.

Alternatively, however, it is conceivable and certainly expedient if the at least one region for at least temporarily slowing down or stopping the capillary flow of the sample liquid is formed by cross-sectional constrictions and expansions introduced in the distributor channel and alternating in the direction of flow of the sample liquid. If the component is made of plastics, cross-sectional constrictions and expansions of this kind can be produced by the moulding techniques conventionally used in injection moulding.

It may be expedient if the component has more than two additional chambers, particularly four. This makes it possible to carry out a plurality of detection reactions with a single biosensor.

A biosensor having a component embodied according to the invention leads to faster and more accurate measurements.

However, the invention also relates to a method of producing a region for at least temporarily slowing down or stopping the capillary flow of a sample liquid in a channel of a biosensor.

Usually, the slowing down or stopping of the capillary flow of a sample liquid in a channel (capillary stop) is achieved by abruptly widening out the channel in one or both directions perpendicular to the direction of filling of the channel (or to the direction of flow of the sample liquid). As a result of the abrupt enlargement of the cross-section, the capillary forces that move the meniscus of a liquid front of the sample liquid along the channel are also abruptly reduced. The flow velocity of the liquid therefore decreases dramatically, possibly to zero. Producing a (geometrically produced) capillary stop of this kind by conventional moulding technology is laborious inasmuch as complex machining of the mould insert is needed in order to produce the necessary sharp edges in the moulding part and because of the associated high costs an economy of process can only be achieved at very high production rates.

A further aim of the invention is also to provide a simple and economical process for producing a region for at least temporarily slowing down or stopping the capillary flow of a sample liquid in a channel of a biosensor.

According to the invention this process comprises the following steps:
rendering the channel hydrophilic with a hydrophilic coating, at least in parts
removing the hydrophilic coating, at least in parts.

By rendering the channel hydrophilic with a hydrophilic coating, at least in parts, and subsequently removing the hydrophilic coating, at least in parts, it is possible over all to achieve a simple manufacture that is economical even for small numbers of items. Moreover, the hydrophilic coating of the channel and also the removal of the hydrophilic coating can be implemented comparatively simply by various methods.

For example, it is very advantageous to spray on the hydrophilic coating. This can be done, for example, using a mask, so that only specified areas are deliberately made hydrophilic. Spraying allows a large area to be rendered hydrophilic and is easily incorporated in mass production.

The partial removal of the hydrophilic coating can be carried out very advantageously using a laser. Again, it is advisable to use a corresponding mask as this makes controlled removal of the coating possible in spite of the laser irradiation of larger areas.

Very precise treatment or removal of the coating is possible if the hydrophilic coating is ablated. In this process, the material to be removed changes from a solid state directly into a vapour stage, thus avoiding contamination or geometric inaccuracies caused by the removed material. Any regions not exposed to the laser irradiation are not affected. Suitable lasers for this purpose include, in particular, an excimer laser. Lasers of this kind produce electromagnetic radiation in the ultraviolet wavelength range (for example 248 manometers) and can only be operated in pulses. The high pulse energies of up to 300 millijoules that can be achieved ensure good ablation.

It is also very easy to adjust the desired intensity of the capillary stop or the degree of desired slowing of the sample liquid (and thus in the last analysis the degree of sequential filling) using process parameters. Suitable parameters include for example the number of impinging laser pulses for each region treated (laser energy) and/or the position of the treated region between two successive receiving devices, viewed in the direction of flow. The latter can be adjusted for example by a suitable choice of mask. Tests have shown that the position of such a region for temporarily slowing down or stopping the capillary flow, viewed in the direction of flow, is preferably to be provided within the first half of the distance, particularly within the first third of the distance, between directly consecutive feed channels. This results comparatively in a particularly good sequential filling of the receiving devices arranged one after another.

Moreover, it is naturally also possibly and certainly advantageous to make the distributor channel from a material that is sensitive to the wavelength of the laser used. In this case, the material (such as polycarbonate) that is present under the hydrophilic coating could be significantly removed or ablated, which would increase the desired effect in the treated region, as it would result in an increased widening of the cross-section of the channel.

Figure 2:
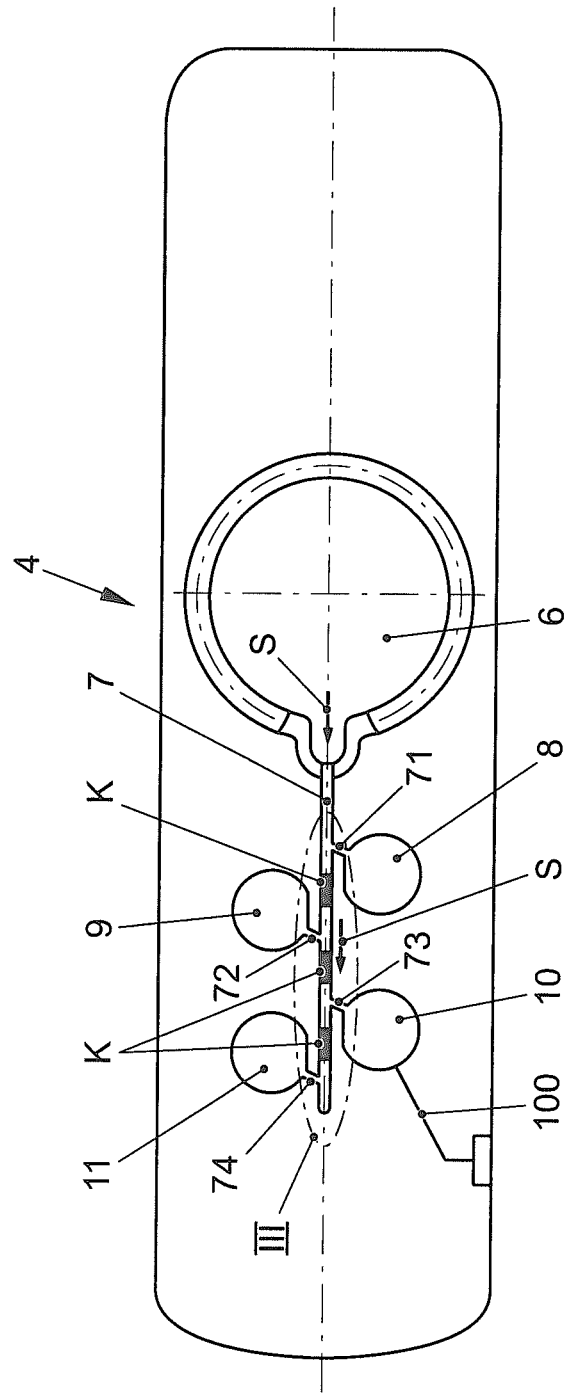
Figure 4A:
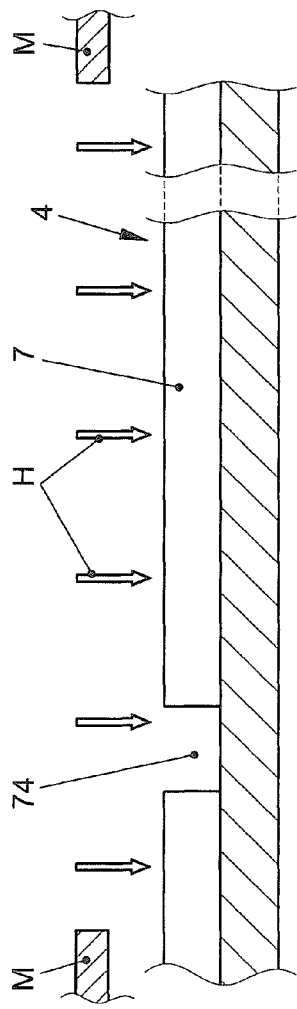

Further features and embodiments of the invention will become apparent from some examples described in more detail with reference to the accompanying Figures. In the drawings:

FIG. 1 shows an extremely diagrammatic representation of a biosensor made up of a number of components, in longitudinal section, FIG. 2 shows a simplified view of a component of the biosensor according to view II in FIG. 1, which is embodied according to the invention and wherein the components above it have been omitted in the interests of clarity, FIG. 3 shows an enlarged detail according to detail III from FIG. 2, namely a) as a preferred embodiment and b) as a further embodiment, FIG. 4 shows a basic representation of the method according to the invention for producing a region for at least temporarily slowing down or stopping the capillary flow of a sample liquid in the channel of a biosensor according to section IV in FIG. 3a.

FIG. 1 shows, in highly diagrammatic form, a side view (in section) of a possible embodiment of a biosensor 1 containing a component 4 embodied according to the invention. The biosensor 1 is essentially made up of three flat components 2, 3 and 4, substantially rectangular in outline, made of plastics (for example polycarbonate or polystyrene), components 2, 3 and 4 being adhesively bonded to one another. At least component 4 has been produced by injection moulding. The upper component 2 has an opening 20 for the introduction of a sample liquid P (for example blood). For this purpose, a patient can place his exposed finger pad in the opening 20. Underneath the opening 20 is a recess 21 for partially receiving a filter 5. The second component 3 also has an opening 40 located underneath the recess 21, into which the filter 5 can protrude. The filter 5 is used to filter the sample liquid P, a filtered sample liquid P' from the filter (such as blood plasma from whole blood) being produced at the bottom. To receive the filtered sample liquid P' the third component 4 has a first receiving device 6. The receiving device 6 serves not only to receive the filtered sample liquid P' and "suck" it out of the filter 5 but also to convey the filtered sample liquid P' to a distributor channel 7 (cf. arrows). The distributor channel 7 is part of a channel system which fluidically connects the filtered sample liquid P' to other receiving devices 8 to 11 of the third component 4 (cf. also FIG. 2). The further receiving devices 8 to 11 are well-like in configuration, the filtered sample liquid P' in the distributor channel 7 following a direction of flow S in relation to which the receiving device 8 is at the beginning and the receiving device 11 is at the end.

It is also apparent that the second component 3 also comprises receiving devices 12 to 15 for the filtered sample liquid P'. The receiving devices 12 to 15 are also well-like in configuration and are arranged substantially concentrically to the associated receiving devices 8 to 11 of the third component 4. Between the receiving devices 8 to 11 on the one hand and the receiving devices 12 to 15 on the other hand, there is a fluidic connecting path (not shown in detail), so that the associated pairs of receiving devices (for example 8 and 12) form a kind of chamber. The receiving devices 12 to 15 are connected to an electrode system 17 shown in the drawings. Moreover, dried reagents are placed in the receiving devices 12 to 15, which trigger an electrochemical reaction after being dissolved by the filtered sample liquid P'. The result of this reaction is characteristic of the analytes that are to be measured. The electron system 17 is provided for measurably recording these electrochemical reactions.

FIG. 2 shows the component 4 individually in plan view according to view II from FIG. 1. In this Figure the component is also shown in a simplified view, showing only the structures that are most important for understanding the invention. The component 4 is about 40 mm long, 10 mm wide and 1.5 mm high. The Figure shows the receiving device 6 which is located within a recess of the component 4 and which, as already explained, serves to receive and then convey the filtered sample liquid P'. The sample liquid P' that is received by the receiving device 6 is conveyed to the distributor channel 7. This view shows that the receiving devices 8 to 11 are arranged on both sides of the distributor channel 7, the receiving devices 9 and 11 being located on one side, the receiving devices 8 and 10 being on the other side. To enable the receiving devices 8 to 11 to be filled with sample liquid P' the distributor channel 7 is connected to the receiving devices 8 to 11 via a feed channel in each case (cf. 71 to 74). Viewed in the direction of flow S of the sample liquid P', the feed channels 71 to 74 are located behind one another, the sample liquid P' arriving first at the feed channel 71, then at the feed channel 72, then at the feed channel 73 and finally at the feed channel 74.

To achieve a better (faster) capillary conveying of the sample liquid P', the surface of the component 4 is made hydrophilic or provided with a hydrophilic coating at least in the region of the distributor channel 7 and the feed channels 71 to 74. However, in addition, more regions K are provided in the distributor channel 7, which are supposed to at least temporarily slow down or stop the capillary flow of the filtered sample liquid P', as will be explained in more detail hereinafter. As can be seen, a region K is provided in each case in the distributor channel 7 between two feed channels immediately following one another in the direction of flow S (i.e. between the feed channels 71 and 72 or 72 and 73 or 73 and 74). The configuration or even the number of the regions K provided between two immediately succeeding feed channels is dependent on the delaying of the capillary flow that is required or desired in that instance. The provision of the regions K has the following rationale:

The reagents located in the receiving devices 12 to 15 can only be optimally dissolved (without the formation of lumps) if they are rapidly and completely wetted with the filtered sample solution P'. This is only possible if the receiving devices 8 to 11 of the component 4 that are each associated with the receiving devices 12 to 15 are also each rapidly filled completely with sample liquid P' and, as a result of the fluidic connection between the receiving devices 8 to 11 with the receiving devices 12 to 15 respectively associated with them, there is a rapid increase in the liquid level in the receiving devices 12 to 15 containing the reagents. Care should be taken to ensure that there are only very limited amounts of filtered sample liquid P' available. This is partly because only a very small amount of sample liquid P (generally only about 20 µl of e.g. whole blood) is added and also because, as the result of a reduction in the volume flow in the filter, after a short time, more and more filtered sample liquid P' comes up "behind". Therefore, the receiving devices 8 to 11 or 12 to 15 have to be properly filled as quickly as possible.

Without the provision of the above-mentioned regions K, the hydrophilic coating of the distributor channel 7 and the feed channels 71 to 74 would cause the volume flow of the filtered sample liquid P' to reach all the feed channels 71 to 74 almost simultaneously and would also fill all the receiving devices 8 to 11 or 12 to 15 virtually simultaneously. This division of the volume flow would, however, cause the filling of the individual receiving devices 8 to 11 or 12 to 15 to take longer, or might not happen in an optimum manner, which would be undesirable. As a result of the provision of the regions K the sample liquid P' penetrates initially unhindered through the hydrophilised distributor channel 7 and into the feed channel 71 and is rapidly able to fill the first receiving device 8 and the receiving device 12 associated therewith. The entire volume flow of sample liquid P' is available for filling, as on reaching the region K it is stopped, or at least slowed down, such that there is sufficient time remaining for the sample liquid P' to fill the first receiving device 8 and the associated receiving device 12 completely, before reaching the next feed channel 72. Even if there were to be a total capillary stop of the sample liquid P' in the region K, the capillary flow would start up again after a specified short time as the result of various factors (including the hydrostatic pressure of the sample liquid P stored in the direction of flow S). The sample fluid P' also exhibits corresponding fluidic behaviour in the other regions K or in the receiving devices 9 to 11 or 13 to 15 following on the direction of flow S. Each of the receiving devices 8 to 11 has a venting device 100 associated with it, of which only the one associated with the receiving device 10 is shown.

FIG. 3 shows the region of the distributor channel 7 with the region K introduced between the feed channels 71 to 74 in more detail. Thus, FIG. 3a shows a preferred embodiment of the regions K. In fact, the regions K are of a hydrophobic nature compared with the remainder of the distributor channel 7, which is provided with a hydrophilic coating 70. As shown, the hydrophobic coating extends right into the feed channels 71 to 74 and the corresponding receiving devices 8 to 11.

FIGS. 3*b* and *bb* show an alternative embodiment K' of these regions in which the desired effect of the at least temporary stopping or slowing down of the capillary flow of the sample liquid P' is obtained solely by changing the geometry of the distributor channel 7. Specifically, in the regions K', regions of cross-sectional constrictions 75 and cross-sectional expansions 76 are provided which alternate in the direction of flow S. To produce the required sharp edges in the moulding portion, however, complex machining of the mould insert is required, which means that manufacture is only economically viable for very high production runs. Over all, tests have shown, moreover, that a better fluidic activity can be achieved using the process according to the invention (cf. FIG. 4).

FIG. 4 shows the process according to the invention in more detail, by which the hydrophobic regions K shown in FIG. 3*a* can be introduced into the distributor channel 7. The distributor channel 7 preferably has dimensions of about 150 to 200 microns wide and high, while the dimensions of the feed channels 71 to 74 are slightly smaller.

First of all the component 4 is sprayed with a hydrophilic liquid H in the region of the distributor channel 7, the feed channels 71 to 74 and the receiving devices 8 to 11. This is carried out over a large area and is therefore suitable for corresponding mass production. If required, a mask M may be used (cf. FIG. 4*a*).

Figure 4B:
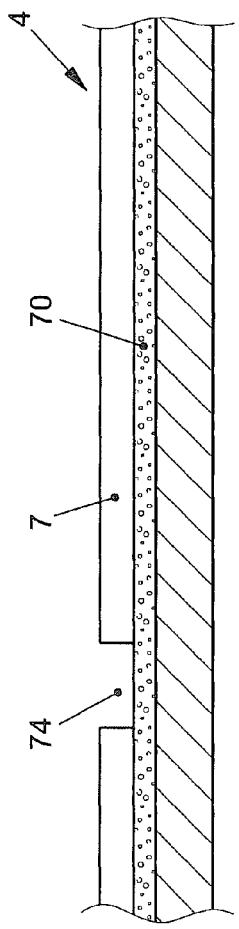

The hydrophilic liquid H is deposited as a hydrophilic coating 70 in the area that is not covered by the mask M (cf. FIG. 4*b*).

Figure 4C:
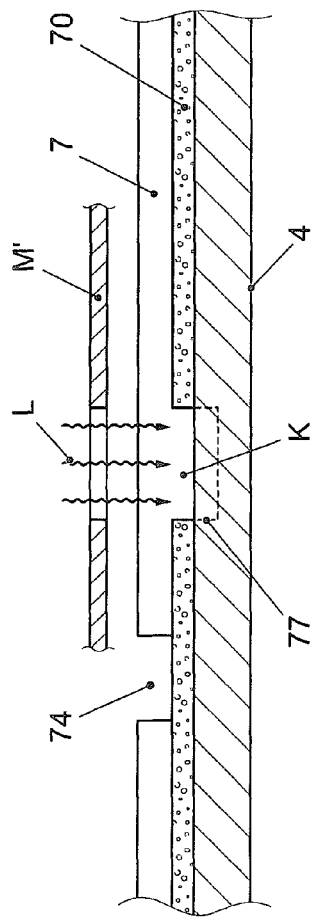

The hydrophilic coating 70 is then removed again in some areas using laser beams L. Again, a mask M' is preferably used. The use of an excimer laser for the laser has proved highly satisfactory. It develops energy densities within the range of the impinging laser beams L that are high enough to enable good ablation of the materials that are to be removed. The removal of the layers that are to be removed may be carried out with great precision and without any appreciable contamination of the surrounding area with removed material. FIG. 4*c* shows how a region K has formed in the distributor channel 7 of the component 4 as a result of the irradiation of the component 4 with laser radiation L. As a result of the removal of the hydrophilic coating 70 in the region K the surface of the underlying material of the component 4 which is made of a less hydrophilic material than the coating 70 is exposed once more. Any areas that are not exposed to the laser radiation L (i.e. masked areas) are unchanged. It should be pointed out that the material underneath the hydrophilic layer 70 exposed is not changed, or is only changed to a negligible degree, if the material of the component 4 is a material that is substantially insensitive to the wavelength of the laser used. This is the case with polystyrene, for example. If a material were used which is essentially sensitive to the wavelength of the laser used, such as polycarbonate, the material underneath the hydrophilic coating 70 would also be ablated during the laser machining and there would be an additional cross-sectional expansion 77 (shown by broken lines) in the component 4. As a result of this additional cross-sectional expansion the desired effect of the region K (slowing down or stopping the capillary flow) would be further intensified. Parameters that may be used to adjust the above-mentioned effect of the region K as required include primarily:

the number of laser pulses impacting each site being treated (laser energy)

the position of the treated area between two successive receiving devices viewed in the direction of flow (optionally dependent on the mask)

the choice of material located underneath the hydrophilic coating 70.

The position of such a region K for temporarily slowing down or stopping the capillary flow, viewed in the direction of flow, was preferably provided within the first half of the distance, more particularly within the first third of the distance, between directly consecutive feed channels. This was also true of the position of the regions K' (this preferred position is not shown in the Figures).

LIST OF REFERENCE NUMERALS

1 biosensor
2 first component
3 second component
4 third component
5 filter
6 first receiving device of the third component 4
7 distributor channel
8-11 further receiving devices of the third component 4
12-15 receiving devices of the second component 3
17 electrode system
20 opening for the addition of the sample liquid P
21 depression for accommodating the filter 5
40 opening
70 hydrophilic coating
71-74 feed channels branching off from the distributor channel 7
75 cross-sectional constriction
76 cross-sectional expansion
77 cross-sectional expansion in the third component 4
100 venting device
H hydrophilic liquid
K, K' region provided for at least temporarily slowing down or stopping the capillary flow of the filtered sample liquid P'
L laser radiation
M, M' mask
P sample liquid
P' filtered sample liquid
S direction of flow of P' in the distributor channel 7

The invention claimed is:

1. A component (4) of a biosensor (1), comprising:
at least one first device (6) for receiving a sample liquid (P, P'), wherein the at least one first device (6) is connected via a distributor channel (7) to further receiving devices (8,9,10,11), into each of which (8,9,10,11) a feed channel (71,72,73,74) branching off from the distributor channel (7) opens, and the feed channels (71,72,73,74) are arranged consecutively in the direction of flow (S) of the sample liquid (P') conveyed through the distributor channel (7), and
at least one region (K, K') for at least temporarily slowing down or stopping the capillary flow of the sample liquid (P') located in the distributor channel (7), in each case between two immediately consecutive feed channels (71,72 or 72,73 or 73,74) in the direction of flow (S),
wherein the at least one region (K, K') is implemented at a corresponding at least one section of the distributor channel (7) via:
(i) a base material having voids therein that define the distributor channel (7) and an inside surface thereof;
(ii) a hydrophilic coating (70) disposed on the inside surface of the distributor channel (7);

(iii) at least one part of the hydrophilic coating (70) having been removed to create a window that exposes the base material through the window of the hydrophilic coating (70) at the corresponding at least one section of the distributor channel (7); and (iv) a recess (77) into the base material in registration with the window of the hydrophilic coating (70), thereby providing at least one cross-sectional expansion of the distributor channel (7) in registration with the window through the hydrophilic coating (70) at the at least one region (K, K').

2. The component (4) according to claim 1, wherein the at least one region (K) further includes at least one hydrophobic surface present in the distributor channel (7).

3. The component (4) according to claim 1, further comprising cross-sectional expansions (76) and constrictions (75) provided in the distributor channel (7) that alternate in the direction of flow of the sample liquid (P').

4. The component (4) according to claim 1, wherein more than two further receiving devices (8,9,10,11) are provided.

5. A process for producing a region (K) for at least temporarily slowing down or stopping the capillary flow of a sample liquid (P') at a corresponding section of a channel (7) of a biosensor (1), comprising the following steps:
providing a base material having voids therein that define the distributor channel (7) and an inside surface thereof,
rendering the channel (7) hydrophilic by depositing a hydrophilic coating (70) on the inside surface of the distributor channel (7),
removing a part of the hydrophilic coating (70) to create a window that exposes the base material through the window of the hydrophilic coating (70) at the corresponding section of the distributor channel (7),
removing a part of the base material to form a recess (77) into the base material in registration with the window of the hydrophilic coating (70), thereby providing at least one cross-sectional expansion of the distributor channel (7) in registration with the window through the hydrophilic coating (70) at the region (K).

6. The process according to claim 5, wherein the hydrophilic coating (70) is sprayed on.

7. The process according to claim 6, wherein the hydrophilic coating (70) is sprayed on using a mask (M).

8. The process according to claim 5, wherein the part of the hydrophilic coating (70) is removed using a laser (L).

9. The process according to claim 5, wherein the hydrophilic coating (70) is removed using a mask (M').

10. The process according to claim 8, wherein the part of the hydrophilic coating (70) is ablated, and the base material is formed of a material that is sensitive to the ablation such that removal of the part of the hydrophilic coating (70) also removes the part of the base material to form the recess (77).

11. The process according to claim 8, wherein the base material is chosen to be of a material that is sensitive to the wavelength of the laser (L) used, such that removal of the part of the hydrophilic coating (70) also removes the part of the base material to form the recess (77).

* * * * *